US012732152B2

(12) United States Patent
Kimura

(10) Patent No.: US 12,732,152 B2

(45) Date of Patent: Sep. 8, 2026

(54) PIEZOELECTRIC THIN FILM RESONATOR

(71) Applicant: Murata Manufacturing Co., Ltd., Nagaokakyo (JP)

(72) Inventor: Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 742 days.

(21) Appl. No.: 18/136,374

(22) Filed: Apr. 19, 2023

(65) Prior Publication Data

US 2023/0261629 A1 Aug. 17, 2023

Related U.S. Application Data

(63) Continuation of application No. PCT/JP2021/040844, filed on Nov. 5, 2021.

(30) Foreign Application Priority Data

Nov. 13, 2020 (JP) ................................ 2020-189201

(51) Int. Cl.
*H03H 9/02* (2006.01)
*H03H 9/17* (2006.01)

(52) U.S. Cl.
CPC ........ *H03H 9/02031* (2013.01); *H03H 9/173* (2013.01); *H03H 9/175* (2013.01); *H03H 9/176* (2013.01)

(58) Field of Classification Search
CPC .... H03H 9/02031; H03H 9/173; H03H 9/175; H03H 9/176; H03H 9/02015
See application file for complete search history.

(56) References Cited

U.S. PATENT DOCUMENTS 9,136,819 B2 * 9/2015 Grannen ................ H03H 9/132
10,069,473 B2 * 9/2018 Umeda .................... H03H 3/02
2008/0296529 A1 12/2008 Akiyama et al.
2013/0127300 A1 5/2013 Umeda et al.
2014/0354109 A1 12/2014 Grannen et al.
2019/0363243 A1 11/2019 Tanaka et al.

FOREIGN PATENT DOCUMENTS

JP 2009010926 A 1/2009
JP 2013128267 A 6/2013
JP 2019207910 A 12/2019

OTHER PUBLICATIONS

Aigner et al., "Pushing BAW beyond 'known' Frontiers: Higher, Wider, Smaller, Cooler," Seventh International Symposium on Acoustic Wave Devices for Future Mobile Communication Systems, Chiba University, Japan, Mar. 2018, pp. 28-33.
International Search Report in PCT/JP2021/040844, mailed Dec. 14, 2021, 3 pages.
Written Opinion in PCT/JP2021/040844, mailed Dec. 14, 2021, 3 pages.

* cited by examiner

*Primary Examiner* — Emily P Pham
(74) *Attorney, Agent, or Firm* — Keating & Bennett, LLP

(57) ABSTRACT

A piezoelectric thin film includes a piezoelectric element and a substrate supporting the piezoelectric element. The piezoelectric element includes a piezoelectric thin film and first and second electrodes opposing each other with the piezoelectric thin film interposed therebetween. The piezoelectric thin film has a first-electrode-side content of each of aluminum and scandium higher than a second-electrode-side content thereof and a first-electrode-side content of nitrogen lower than a second-electrode-side content thereof.

15 Claims, 3 Drawing Sheets

PIEZOELECTRIC THIN FILM RESONATOR

CROSS REFERENCE TO RELATED APPLICATIONS

This application claims the benefit of priority to Japanese Patent Application No. 2020-189201 filed on Nov. 13, 2020 and is a Continuation Application of PCT Application No. PCT/JP2021/040844 filed on Nov. 5, 2021. The entire contents of each application are hereby incorporated herein by reference.

BACKGROUND OF THE INVENTION

1. Field of the Invention

The present invention relates to a piezoelectric thin film resonator.

2. Description of the Related Art

Regarding piezoelectric thin films used for piezoelectric thin film resonators, it is known that the piezoelectric responsiveness is improved by adding scandium to an aluminum nitride film (for example, Japanese Unexamined Patent Application Publication No. 2009-10926 and Japanese Unexamined Patent Application Publication No. 2013-128267).

However, according to Robert Aigner et al., "Pushing BAW beyond 'known' Frontiers: Higher, Wider, Smaller, Cooler", Seventh International Symposium on Acoustic Wave Devices for Future Mobile Communication Systems, March, 2018, it has been reported that when the amount of scandium added to the aluminum nitride film is increased, the band width is increased while the Q-value indicating the resonance characteristics is decreased.

SUMMARY OF THE INVENTION

Preferred embodiments of the present invention provide piezoelectric thin film resonators that each ensure compatibility between an improvement in the band width and maintenance of resonance characteristics.

A piezoelectric thin film resonator according to a preferred embodiment of the present invention includes a piezoelectric thin film including aluminum nitride as a primary component and scandium, a first electrode, a second electrode opposed to the first electrode with the piezoelectric thin film interposed therebetween, and a substrate to support a piezoelectric element including the first electrode, the second electrode, and the piezoelectric thin film. The piezoelectric thin film has a first-electrode-side content of each of scandium and aluminum higher than a second-electrode-side content of each of scandium and aluminum and has a first-electrode-side content of nitrogen lower than a second-electrode-side content of nitrogen.

According to preferred embodiments of the present invention, piezoelectric thin film resonators each ensure compatibility between an improvement in the band width and maintenance of resonance characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
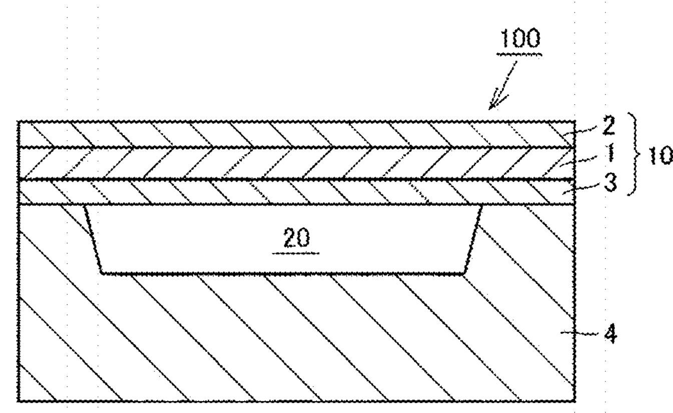
FIG. 1 is a schematic sectional view illustrating a piezoelectric thin film resonator according to a preferred embodiment of the present invention.

Preferred embodiments of the present invention will be described below in detail with reference to the drawings. In the drawings, the same or corresponding portions are indicated by the same references, and explanations thereof will not be repeated.

Basic Configuration of Piezoelectric Thin Film Resonator

FIG. 1 is a schematic sectional view illustrating a piezoelectric thin film resonator according to a preferred embodiment of the present invention. The configuration of the piezoelectric thin film resonator 100 includes a piezoelectric element 10 and a substrate 4 supporting the piezoelectric element 10.

A cavity 20 is provided between the piezoelectric element 10 and the substrate 4. More specifically, the piezoelectric element 10 is supported by the substrate 4 so that an edge portion of the piezoelectric element 10 is in contact with the substrate 4, and a central portion of the piezoelectric element 10 is disposed at a distance from the substrate 4.

The piezoelectric element 10 includes the piezoelectric thin film 1 and a pair of electrodes (first electrode 2 and second electrode 3) disposed at positions opposing each other with the piezoelectric thin film 1 interposed therebetween.

The first electrode 2 and the second electrode 3 oppose each other with the piezoelectric thin film 1 interposed therebetween. The central portion of the piezoelectric element 10 is excited by applying an alternating current electric field between the first electrode 2 and the second electrode 3. The piezoelectric thin film resonator 100 uses a bulk wave generated due to the excitation.

The substrate 4 includes optional materials such as, for example, high-resistance silicon, glass, gallium arsenide, ceramic sintered body, and quartz. The first electrode 2 and the second electrode 3 include optional materials, for example, metals such as titanium, molybdenum, ruthenium, tungsten, aluminum, platinum, iridium, copper, chromium, and scandium and alloys or multilayer bodies thereof.

The piezoelectric thin film 1 is a thin film in which aluminum nitride is a primary component and scandium is added. In this regard, the piezoelectric thin film 1 includes, for example, nitrogen, aluminum, and scandium and may include other elements, such as impurities, for example. Herein, the primary component of the piezoelectric thin film 1 denotes a component with an atomic concentration (atm %: atomic %) of more than 50 atm % relative to all components in the piezoelectric thin film 1. That is, in the piezoelectric thin film 1 according to the present preferred embodiment, the total of the atomic concentration of nitrogen in the entire piezoelectric thin film 1 and the atomic concentration of aluminum in the entire piezoelectric thin film 1 is about 50 atm % or more.

Thereafter, when the total amount of nitrogen (N), aluminum (Al), and scandium (Sc) is assumed to be 100 atm %, the percentage of the number of atoms (atm %: atomic %) of each element is taken as the content.

The piezoelectric thin film 1 includes a first-electrode-2-side content of each of aluminum and scandium higher than a second-electrode-3-side content thereof and to have a first-electrode-2-side content of nitrogen lower than a second-electrode-3-side content thereof. In this regard, the piezoelectric thin film 1 may be configured to have a second-electrode-3-side content of each of aluminum and scandium higher than a first-electrode-2-side content thereof and to have a second-electrode-3-side content of nitrogen lower than a first-electrode-2-side content thereof.

That is, the piezoelectric thin film 1 is structured so that the content of nitrogen is increased in the thickness direction of the piezoelectric thin film 1 and in the direction in which the contents of aluminum and scandium are decreased.

The piezoelectric thin film 1 being structured so that the content of nitrogen is increased in the direction in which the contents of aluminum and scandium are decreased enables the piezoelectric thin film resonator 100 according to the present preferred embodiment to ensure compatibility between an improvement in the band width and maintenance of resonance characteristics since the band width can be improved while the resonance characteristics are reduced or prevented from deteriorating even when the content of scandium is increased.

Scandium, aluminum, and nitrogen are included and have a concentration gradient in the thickness direction of the piezoelectric thin film 1. Having a concentration gradient in the thickness direction of the piezoelectric thin film 1 denotes that the concentration continuously changes in the thickness direction.

In this regard, the piezoelectric thin film 1 may have a configuration in which a plurality of films having contents of scandium, aluminum, and nitrogen which differ from those of other films are stacked.

As an example, the piezoelectric thin film 1 according to the present preferred embodiment is formed by using an optional method, such as sputtering or CVD (Chemical Vapor Deposition), for example. For example, a target including aluminum and a target including scandium are used, and sputtering is performed in a nitrogen atmosphere so as to form a piezoelectric thin film having a concentration gradient in the thickness direction by changing the conditions (for example, electric power, gas pressure, and gas flow rate) over time during sputtering. In this regard, an example in which two targets are used is described, but formation may be performed by a unitary sputtering method in which a single target is used. In such an instance, as an example, an alloy including scandium and aluminum is used as the target.

Characteristics of Piezoelectric Thin Film

It will be described with reference to FIG. 2 to FIG. 7 that using the piezoelectric thin film according to the present preferred embodiment enables the band width to be improved while the resonance characteristics are reduced or prevented from deteriorating even when the content of scandium is increased.

Figure 2:
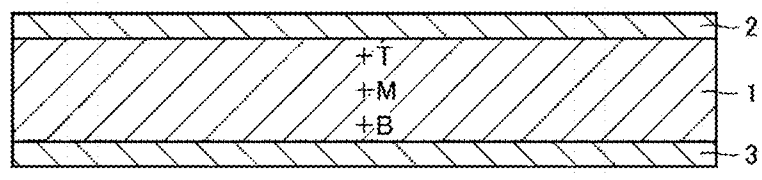
FIG. 2 is a schematic sectional view illustrating a cross section of a piezoelectric element.

Three types of piezoelectric thin film resonators were prepared. FIG. 2 is a schematic sectional view illustrating a cross section of a piezoelectric element. The total amount of nitrogen (N), aluminum (Al), and scandium (Sc) was assumed to be 100 atm %, and the atomic concentration of each element included in each of three regions (T, M, B) on the piezoelectric thin film 1 illustrated in FIG. 2 was measured by transmission electron microscope-energy dispersive X-ray analysis (TEM-EDX). Table 1 presents the results measured by using TEM-EDX.

In this regard, the average atomic concentration of scandium in Table 1 is the average value of the atomic concentration of scandium measured in each of the three regions (T, M, B) and corresponds to the content of scandium in the entire piezoelectric thin film. In addition, the content of scandium in the entire piezoelectric thin film is determined by measuring and averaging the content in each of at least two regions which are located at different positions in the thickness direction. When the piezoelectric thin film is formed by stacking a plurality of films having contents of scandium, aluminum, and nitrogen which differ from those of other films, the content of scandium in the entire piezoelectric thin film is determined by averaging the content of scandium contained in each layer, as an example.

TABLE 1

| Sample | Measurement | Atomic concentration [atm %] | | | Average atomic concentration of Sc |
|---|---|---|---|---|---|
| No. | position | N | Al | Sc | [atm %] |
| 1 | T | 21 | 73 | 6 | 4.9 |
| | M | 31 | 65 | 4 | |
| | B | 29 | 66 | 5 | |
| 2 | T | 22 | 68 | 10 | 8.3 |
| | M | 32 | 61 | 7 | |
| | B | 33 | 59 | 8 | |
| 3 | T | 20 | 59 | 22 | 19.5 |
| | M | 28 | 53 | 19 | |
| | B | 32 | 50 | 18 | |

Figure 3:
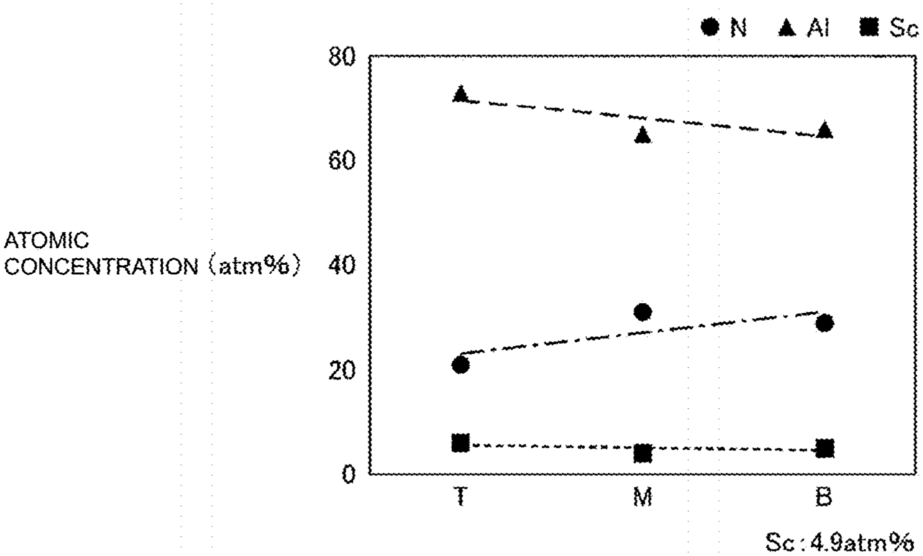
FIG. 3 is a diagram illustrating the result of analyzing a cross section of a piezoelectric thin film of Sample No. 1 by using TEM-EDX.
Figure 4:
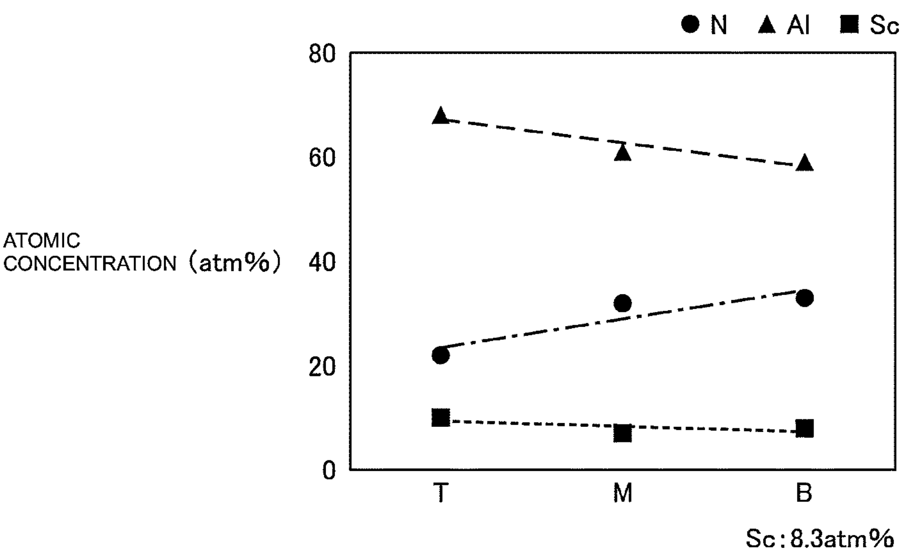
FIG. 4 is a diagram illustrating the result of analyzing a cross section of a piezoelectric thin film of Sample No. 2 by using TEM-EDX.
Figure 5:
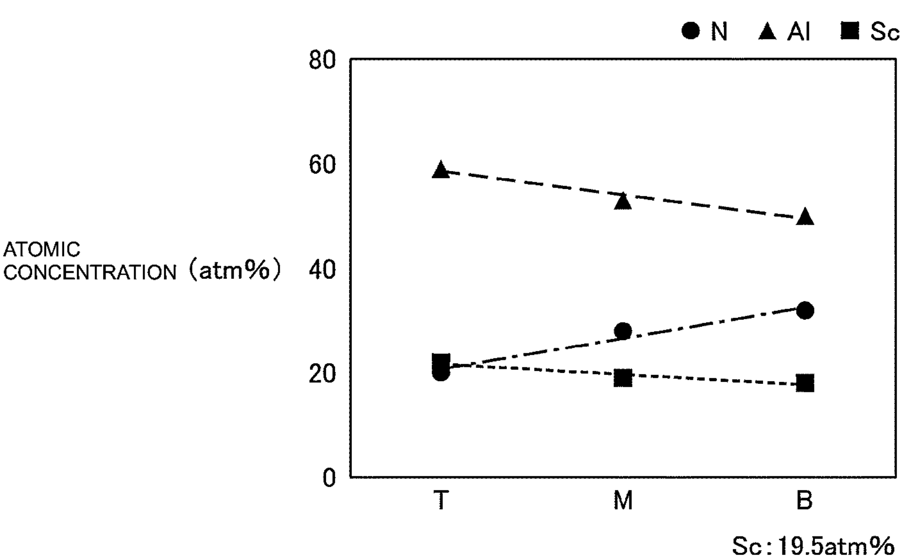
FIG. 5 is a diagram illustrating the result of analyzing a cross section of a piezoelectric thin film of Sample No. 3 by using TEM-EDX.

FIG. 3 is a diagram illustrating the results of analyzing a cross section of a piezoelectric thin film of Sample No. 1 by using TEM-EDX. FIG. 4 is a diagram illustrating the results of analyzing a cross section of a piezoelectric thin film of Sample No. 2 by using TEM-EDX. FIG. 5 is a diagram illustrating the results of analyzing a cross section of a piezoelectric thin film of Sample No. 3 by using TEM-EDX.

As presented in Table 1 and FIG. 3 to FIG. 5, the piezoelectric thin film of each of Sample No. 1 to Sample No. 3 is structured so that the content (atomic concentration) of nitrogen is increased in the thickness direction of the piezoelectric thin film and in the direction in which the contents (atomic concentrations) of aluminum and scandium are decreased.

Table 2 presents the results of calculating the ratio of the amount of change (slope) in the thickness direction of the piezoelectric thin film. The slope is a ratio of the amount of change in the thickness direction of the piezoelectric thin film and was calculated where the position of the surface of the piezoelectric thin film in contact with the first electrode

2 was assumed to be 0, the position of the surface in contact with the second electrode 3 was assumed to be 1, the position of the region T was assumed to be about 0.1, the position of the region M was assumed to be about 0.5, and the position of the region B was assumed to be about 0.9. That is, the slope corresponds to the difference between the content (atomic concentration) in the first-electrode-2-side end portion of the piezoelectric thin film and the content (atomic concentration) in the second-electrode-3-side end portion of the piezoelectric thin film.

TABLE 2

| Sample | Slope | | |
|---|---|---|---|
| No. | N | Al | Sc |
| 1 | 10.0 | −8.8 | −1.3 |
| 2 | 13.8 | −11.3 | −2.5 |
| 3 | 15.0 | −11.3 | −5.0 |

As presented in Table 2, regarding the piezoelectric thin film of Sample No. 1 in which the average atomic concentration of scandium is about 4.9 atm % (refer to Table 1), the absolute value of the difference between the content in the first-electrode-2-side end portion of the piezoelectric thin film and the content in the second-electrode-3-side end portion of the piezoelectric thin film is about 10.0 atm % with respect to nitrogen, about 8.8 atm % with respect to aluminum, and about 1.3 atm % with respect to scandium. Similarly, regarding the piezoelectric thin film of Sample No. 2 in which the average atomic concentration of scandium is about 8.3 atm % (refer to Table 1), the absolute value of the difference between the contents is about 13.8 atm % with respect to nitrogen, about 11.3 atm % with respect to aluminum, and about 2.5 atm % with respect to scandium. Regarding the piezoelectric thin film of Sample No. 3 in which the average atomic concentration of scandium is about 19.5 atm % (refer to Table 1), the absolute value of the difference between the contents is about 15.0 atm % with respect to nitrogen, about 11.3 atm % with respect to aluminum, and about 5.0 atm % with respect to scandium.

Figure 6:
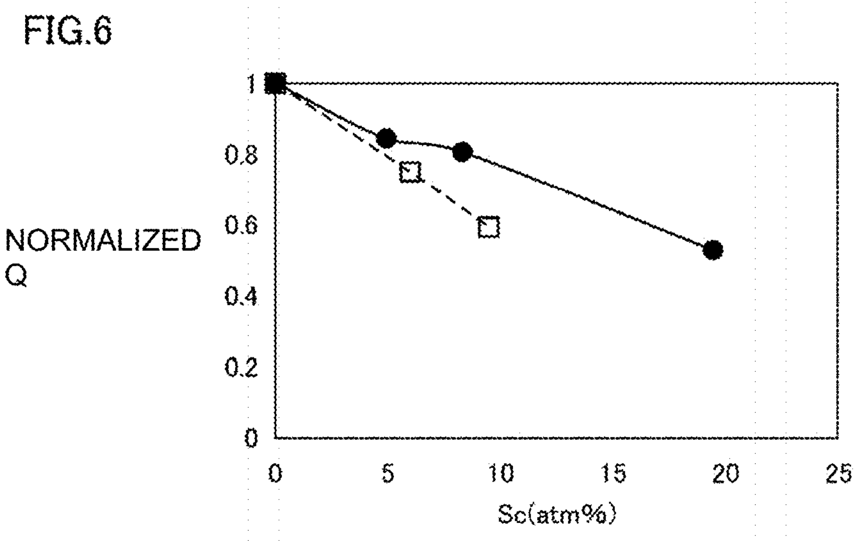
FIG. 6 is a diagram illustrating the relationship between the atomic concentration of scandium and the normalized Q-value.

FIG. 6 is a diagram illustrating the relationship between the atomic concentration of scandium and the normalized Q-value. The normalized Q-value is a value normalized where the Q-value of a sample not containing scandium (sample having a Sc content of 0 atm %) is assumed to be 1 and indicates the resonance characteristics of the piezoelectric thin film resonator.

In FIG. 6, as a comparative example, the broken line represents the relationship between the Q-value and the scandium content illustrated in FIG. 5 of Robert Aigner et al., “Pushing BAW beyond ‘known’ Frontiers: Higher, Wider, Smaller, Cooler”, Seventh International Symposium on Acoustic Wave Devices for Future Mobile Communication Systems, March, 2018. In FIG. 6, as an example of a preferred embodiment of the present invention, the solid line represents the relationship between the Q-values of the samples of Sample No. 1 to Sample No. 3 and the average atomic concentrations of scandium of the samples of Sample No. 1 to Sample No. 3.

As illustrated by the broken line in FIG. 6, in general, the normalized Q-value linear-functionally decreases with increasing content of scandium. On the other hand, the piezoelectric thin film being structured so that the content of nitrogen is increased in the thickness direction of the piezoelectric thin film and in the direction in which the contents of aluminum and scandium are decreased enables the normalized Q-value to be reduced or prevented from decreasing.

In particular, as illustrated in FIG. 6, when the average atomic concentration of scandium, in other words, the content of scandium in the entire piezoelectric thin film, is about 5% or more, the normalized Q-value can be considerably reduced or prevented from decreasing.

Figure 7:
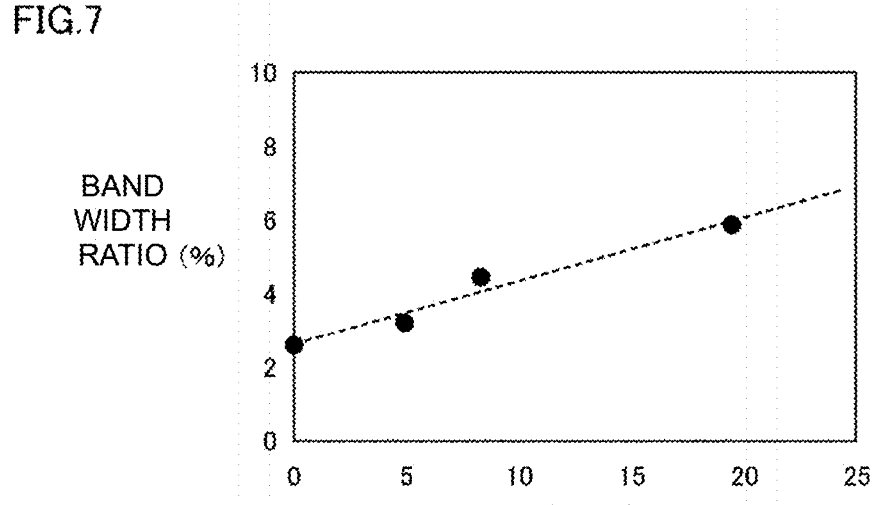
FIG. 7 is a diagram illustrating the relationship between the average atomic concentration of scandium and the band width ratio.

FIG. 7 is a diagram illustrating the relationship between the average atomic concentration of scandium and the band width ratio. It is known that the band width of the resonator increases with increasing concentration of scandium. As illustrated in FIG. 7, even when the piezoelectric thin film is structured such that the content of nitrogen is increased in the thickness direction of the piezoelectric thin film and in the direction in which the contents of aluminum and scandium are decreased, the property that the band width of the resonator increases with increasing concentration of scandium is maintained.

In addition, as presented in Table 2 above, regarding the piezoelectric thin films of Sample No. 1 to Sample No. 3, the absolute value of the difference between the content in the first-electrode-side end portion of the piezoelectric thin film and the content in the second-electrode-side end portion of the piezoelectric thin film is about 10.0 atm % to about 15.0 atm % with respect to nitrogen, about 8.8 atm % to about 11.3 atm % with respect to aluminum, and about 1.3 atm % to about 5.0 atm % with respect to scandium.

That is, it is preferable to use a piezoelectric thin film having an absolute value of the difference between the content in the first-electrode-side end portion of the piezoelectric thin film and the content in the second-electrode-side end portion of the piezoelectric thin film of, for example, about 1.3 atm % or more and about 5.0 atm % or less with respect to scandium, about 8.8 atm % or more and about 11.3 atm % or less with respect to aluminum, and about 10.0 atm % or more and about 15.0 atm % or less with respect to nitrogen. In such an instance, a piezoelectric thin film resonator capable of readily ensuring compatibility between an improvement in the band width and maintenance of resonance characteristics can be provided.

Modified Example of Piezoelectric Thin Film Resonator

Figure 8:
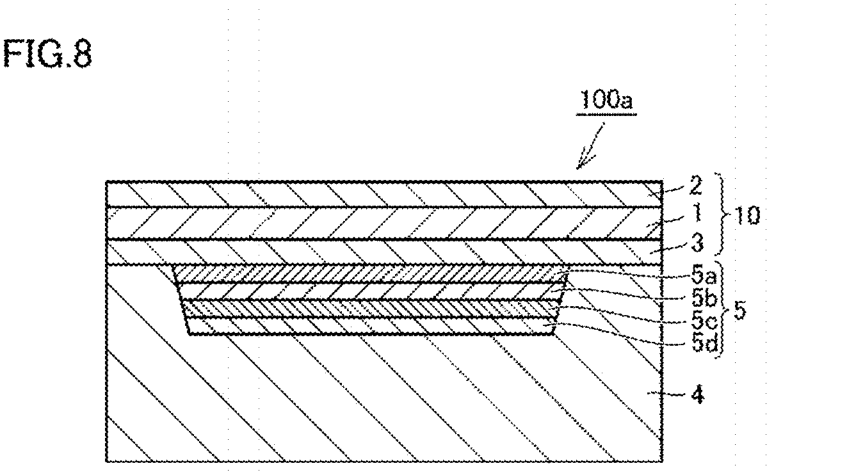
FIG. 8 is a schematic sectional view illustrating a piezoelectric thin film resonator according to a modified example.

FIG. 8 is a schematic sectional view illustrating a piezoelectric thin film resonator according to a modified example of a preferred embodiment of the present invention. In a piezoelectric thin film resonator 100*a*, the cavity 20 is not provided between the piezoelectric element 10 and the substrate 4, and an acoustic reflection layer 5 is provided instead. In this regard, since other points are common to the piezoelectric thin film resonator 100 illustrated in FIG. 1, explanations will not be provided.

The acoustic reflection layer 5 includes a structure in which acoustic impedance layers 5*a* and 5*c* having relatively high acoustic impedance and acoustic impedance layers 5*b* and 5*d* having relatively low acoustic impedance are alternately stacked. Regarding the piezoelectric thin film resonator 100*a* including such an acoustic reflection layer 5, in a manner similar to that of the piezoelectric thin film resonator 100, the piezoelectric thin film 1 structured so that the content of nitrogen is increased in the thickness direction of the piezoelectric thin film 1 and in the direction in which the contents of aluminum and scandium are decreased being used enables compatibility between an improvement in the band width and maintenance of resonance characteristics to be ensured.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric thin film resonator comprising:
a piezoelectric thin film including aluminum nitride as a primary component and scandium;
a first electrode;
a second electrode opposing the first electrode with the piezoelectric thin film interposed therebetween; and
a substrate supporting a piezoelectric element including the first electrode, the second electrode, and the piezoelectric thin film; wherein
the piezoelectric thin film has a first-electrode-side content of each of scandium and aluminum higher than a second-electrode-side content of each of scandium and aluminum and a first-electrode-side content of nitrogen lower than a second-electrode-side content of nitrogen.

2. The piezoelectric thin film resonator according to claim 1, wherein a scandium content in an entirety of the piezoelectric thin film is about 5 atm % or more.

3. The piezoelectric thin film resonator according to claim 1, wherein scandium, aluminum, and nitrogen in the piezoelectric thin film having a concentration gradient in a thickness direction of the piezoelectric thin film.

4. The piezoelectric thin film resonator according to claim 2, wherein scandium, aluminum, and nitrogen in the piezoelectric thin film having a concentration gradient in a thickness direction of the piezoelectric thin film.

5. The piezoelectric thin film resonator according to claim 1, wherein
an absolute value of a difference between the content in the first-electrode-side end portion of the piezoelectric thin film and the content in the second-electrode-side end portion is:
about 1.3 atm % or more and about 5.0 atm % or less with respect to scandium;
about 8.8 atm % or more and about 11.3 atm % or less with respect to aluminum; and
about 10.0 atm % or more and about 15.0 atm % or less with respect to nitrogen.

6. The piezoelectric thin film resonator according to claim 2, wherein
an absolute value of a difference between the content in the first-electrode-side end portion of the piezoelectric thin film and the content in the second-electrode-side end portion is:
about 1.3 atm % or more and about 5.0 atm % or less with respect to scandium;
about 8.8 atm % or more and about 11.3 atm % or less with respect to aluminum; and
about 10.0 atm % or more and about 15.0 atm % or less with respect to nitrogen.

7. The piezoelectric thin film resonator according to claim 3, wherein
an absolute value of a difference between the content in the first-electrode-side end portion of the piezoelectric thin film and the content in the second-electrode-side end portion is:
about 1.3 atm % or more and about 5.0 atm % or less with respect to scandium;
about 8.8 atm % or more and about 11.3 atm % or less with respect to aluminum; and
about 10.0 atm % or more and about 15.0 atm % or less with respect to nitrogen.

8. The piezoelectric thin film resonator according to claim 1, further comprising:
an acoustic reflection layer between the piezoelectric element and the substrate; wherein
the acoustic reflection layer includes a plurality of layers that are stacked; and
the plurality of layers have respective acoustic impedances different from each other.

9. The piezoelectric thin film resonator according to claim 2, further comprising:
an acoustic reflection layer between the piezoelectric element and the substrate; wherein
the acoustic reflection layer includes a plurality of layers that are stacked; and
the plurality of layers have respective acoustic impedances different from each other.

10. The piezoelectric thin film resonator according to claim 3, further comprising:
an acoustic reflection layer between the piezoelectric element and the substrate; wherein
the acoustic reflection layer includes a plurality of layers that are stacked; and
the plurality of layers have respective acoustic impedances different from each other.

11. The piezoelectric thin film resonator according to claim 5, further comprising:
an acoustic reflection layer between the piezoelectric element and the substrate; wherein
the acoustic reflection layer includes a plurality of layers that are stacked; and
the plurality of layers have respective acoustic impedances different from each other.

12. The piezoelectric thin film resonator according to claim 1, wherein a cavity is included between the piezoelectric element and the substrate.

13. The piezoelectric thin film resonator according to claim 2, wherein a cavity is included between the piezoelectric element and the substrate.

14. The piezoelectric thin film resonator according to claim 3, wherein a cavity is included between the piezoelectric element and the substrate.

15. The piezoelectric thin film resonator according to claim 5, wherein a cavity is included between the piezoelectric element and the substrate.

* * * * *